(12) United States Patent
Ren et al.

(10) Patent No.: US 8,789,493 B2
(45) Date of Patent: Jul. 29, 2014

(54) SEALED ELASTOMER BONDED SI ELECTRODES AND THE LIKE FOR REDUCED PARTICLE CONTAMINATION IN DIELECTRIC ETCH

(75) Inventors: Daxing Ren, Pleasanton, CA (US); Enrico Magni, Pleasanton, CA (US); Eric Lenz, Pleasanton, CA (US); Ren Zhou, Fremont, CA (US)

(73) Assignee: Lam Research Corporation, Fremont, CA (US)

(*) Notice: Subject to any disclaimer, the term of this patent is extended or adjusted under 35 U.S.C. 154(b) by 1500 days.

(21) Appl. No.: 11/352,307

(22) Filed: Feb. 13, 2006

(65) Prior Publication Data

US 2007/0187038 A1    Aug. 16, 2007

(51) Int. Cl.
*C23C 16/50* (2006.01)
*H01L 21/306* (2006.01)
*C23F 1/00* (2006.01)

(52) U.S. Cl.
USPC .................. 118/723 E; 156/345.43

(58) Field of Classification Search
CPC ................................. H01J 37/32559
USPC ....... 156/345.43; 118/715, 722, 723 R, 723 E
See application file for complete search history.

(56) References Cited

U.S. PATENT DOCUMENTS

| | | |
|---|---|---|
| 5,074,456 A | 12/1991 | Degner et al. |
| 5,238,499 A | 8/1993 | van de Ven et al. |
| 5,534,751 A | 7/1996 | Lenz et al. |
| 5,569,356 A | 10/1996 | Lenz et al. |
| 6,050,216 A | 4/2000 | Szapucki et al. |
| 6,073,577 A | 6/2000 | Lilleland et al. |
| 6,074,518 A * | 6/2000 | Imafuku et al. .......... 156/345.46 |
| 6,079,356 A | 6/2000 | Umotoy et al. |
| 6,148,765 A | 11/2000 | Lilleland et al. |
| 6,170,432 B1 | 1/2001 | Szapucki et al. |
| 6,194,322 B1 | 2/2001 | Lilleland et al. |
| 6,376,385 B2 | 4/2002 | Lilleland et al. |
| 6,391,787 B1 | 5/2002 | Dhindsa et al. |
| 6,451,157 B1 | 9/2002 | Hubacek |
| 6,818,097 B2 | 11/2004 | Yamaguchi et al. |

(Continued)

FOREIGN PATENT DOCUMENTS

| | | |
|---|---|---|
| CN | 1663016 A | 8/2005 |
| JP | 6-283469 A | 7/1994 |

(Continued)

OTHER PUBLICATIONS

International Preliminary Report on Patentability dated Aug. 28, 2008 for PCT/US2007/003008.

(Continued)

*Primary Examiner* — Maureen Gramaglia
(74) *Attorney, Agent, or Firm* — Buchanan Ingersoll & Rooney PC

(57) ABSTRACT

An electrode assembly for a plasma reaction chamber used in semiconductor substrate processing having a backing member having a bonding surface, an inner electrode having a lower surface on one side and a bonding surface on the other side, and an outer electrode having a lower surface on one side and a bonding surface on the other side. At least one of the electrodes has a flange, which extends underneath at least a portion of the lower surface of the other electrode.

23 Claims, 7 Drawing Sheets

(56) References Cited

U.S. PATENT DOCUMENTS

| | | |
|---|---|---|
| 6,824,627 B2 | 11/2004 | Dhindsa et al. |
| 6,827,815 B2 | 12/2004 | Hytros et al. |
| 6,846,726 B2 | 1/2005 | Ren et al. |
| 2001/0031557 A1 | 10/2001 | Lilleland et al. |
| 2002/0127853 A1 | 9/2002 | Hubacek et al. |
| 2004/0074609 A1 | 4/2004 | Fischer et al. |
| 2005/0045593 A1 | 3/2005 | Ren et al. |
| 2005/0133160 A1 | 6/2005 | Kennedy et al. |

FOREIGN PATENT DOCUMENTS

| | | |
|---|---|---|
| JP | 11-162940 A | 6/1999 |
| JP | 11-256370 A | 9/1999 |
| JP | 2004-6561 A | 1/2004 |
| JP | 2004-524677 A | 8/2004 |
| WO | 02/054444 A1 | 7/2002 |
| WO | 2005/050705 A2 | 6/2005 |
| WO | 2007/094984 A2 | 8/2007 |

OTHER PUBLICATIONS

International Search Report and Written Opinion dated Feb. 13, 2008 for PCT/US07/03008.

Search Report and Written Opinion mailed Jun. 26, 2009 for Singapore Appln. No. 200805907-3.

Chinese Official Action mailed Aug. 28, 2009 for Chinese Patent Appln. No. 200780005363.2.

Substantive Examination Adverse Report issued by the Malaysian Patent Office on Aug. 30, 2010 in corresponding Malaysian Application No. PI 20083041.

Official Action issued by the Japanese Patent Office on Jul. 22, 2011 in corresponding Japanese Patent Application No. 2008-554288, and a partial translation thereof.

* cited by examiner

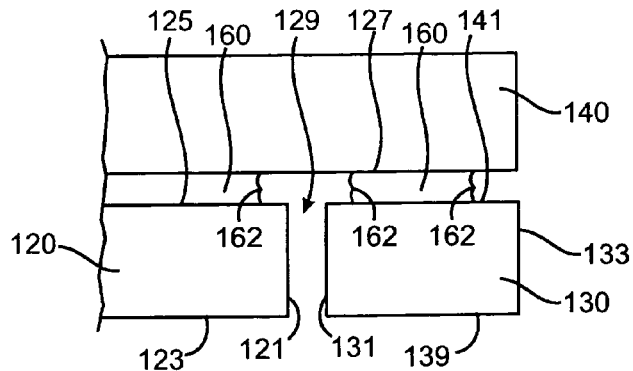
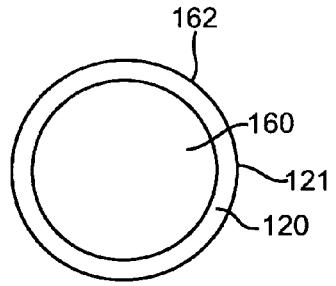
FIG. 6
FIG. 7
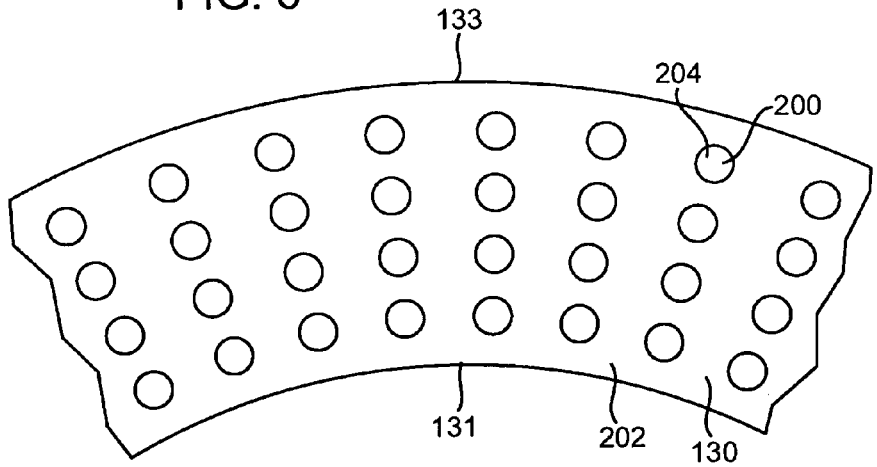
FIG. 8
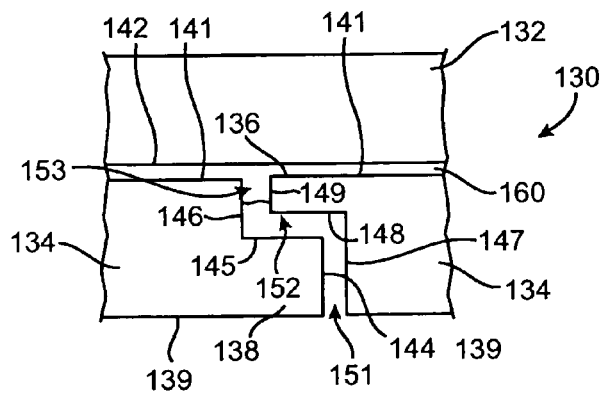
FIG. 9
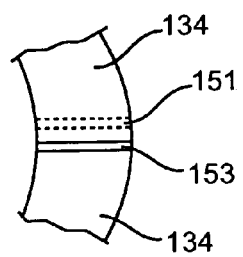
FIG. 10

SEALED ELASTOMER BONDED SI ELECTRODES AND THE LIKE FOR REDUCED PARTICLE CONTAMINATION IN DIELECTRIC ETCH

BACKGROUND

Since the mid-1960s, integrated semiconductor circuits have become the primary components of most electronics systems. These miniature electronic devices may contain thousands of the transistors and other circuits that make up the memory and logic subsystems of microcomputer central processing units and other integrated circuits. The low cost, high reliability and speed of these chips have led them to become a ubiquitous feature of modern digital electronics.

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls.

The etching reactor electrodes may often be fabricated by bonding two or more dissimilar members with mechanically compliant and/or thermally conductive adhesives, allowing for a multiplicity of function. In a number of etching reactors having a bond line or layer between two members, including showerhead electrode assemblies where an inner electrode and an outer electrode are bonded to a backing member, or multiple bond layers incorporating an electrode and/or heating element or assembly, the bond material can be exposed to reaction chamber conditions. In addition, the bond material can be subject to etch out by the direct attack of plasma and radicals generated by the plasma.

Accordingly, there is a need to prevent erosion of the bond material, or at least slow the rate sufficiently, such that an extended and acceptable operational lifetime is obtained for the electrode and its associated bond material during use in semiconductor etching processes without noticeable degradation to the performance or operational availability of the plasma processing system.

SUMMARY

In accordance with one embodiment, an electrode assembly for a plasma reaction chamber used in semiconductor substrate processing comprises: a backing member having a bonding surface; an inner electrode having a lower surface on one side and a bonding surface on the other side; an outer electrode having a lower surface on one side and a bonding surface on the other side; and wherein at least one of the electrodes has a flange, which extends underneath at least a portion of the lower surface of the other electrode.

In accordance with a further embodiment, an electrode assembly useful for a plasma reaction chamber used in semiconductor substrate processing comprises: a backing member having a bonding surface, the backing member having at least one recess for receiving a bonding material; an electrode having a lower surface on one side and a bonding surface on the other side; and wherein the bonding material is confined to the at least one recess.

In accordance with another embodiment, an electrode assembly further comprises: a backing member having a bonding surface, the backing member having at least one recess for receiving a bonding material; an electrode having a lower surface on one side and a bonding surface on the other side; at least one spacer to maintain a gap between the bonding surfaces of the backing member and the electrode; and a bonding material between the bonding surfaces of the backing member and the electrode.

In accordance with a further embodiment, an electrode assembly for a plasma reaction chamber used in semiconductor substrate processing comprises: a backing member having a bonding surface; an electrode having a lower surface on one side and a bonding surface on the other side; and wherein the electrode has a recess for receiving a bonding material and a groove on an outer edge to trap excess bonding material.

In accordance with another embodiment, an electrode assembly for a plasma reaction chamber used in substrate processing comprises: a backing member having a bonding surface; an outer electrode ring having a lower surface on one side and a bonding surface on the other side; and wherein the bonding surface of the outer electrode includes a plurality of recesses.

In accordance with another embodiment, a method of manufacturing an electrode assembly useful for a plasma reaction chamber used in semiconductor substrate processing comprises: providing a backing member having a bonding surface; providing an inner electrode having a lower surface on one side and a bonding surface on the other side; and applying a bonding material to the bonding surfaces of the inner electrode and the backing member, wherein an edge of the bonding material extends to within 1.0 to 3.0 mm of an outer edge of the inner electrode.

BRIEF DESCRIPTION OF THE DRAWINGS

FIG. 6 shows a cross-sectional view of a portion of the showerhead electrode of FIG. 5 having an elastomeric bond according to another embodiment.

FIG. 7 shows a top view of a portion of the showerhead electrode having an elastomeric bond according to a further embodiment.

FIG. 8 shows a top view of a portion of the showerhead electrode having an elastomeric bond according to a further embodiment.

FIG. 9 shows a cross-sectional view of an interface of a multi-part outer electrode and a backing member according to a further embodiment.

FIG. 10 shows a top view of a portion of the multi-part outer electrode of FIG. 9.

DETAILED DESCRIPTION

Figure 1:
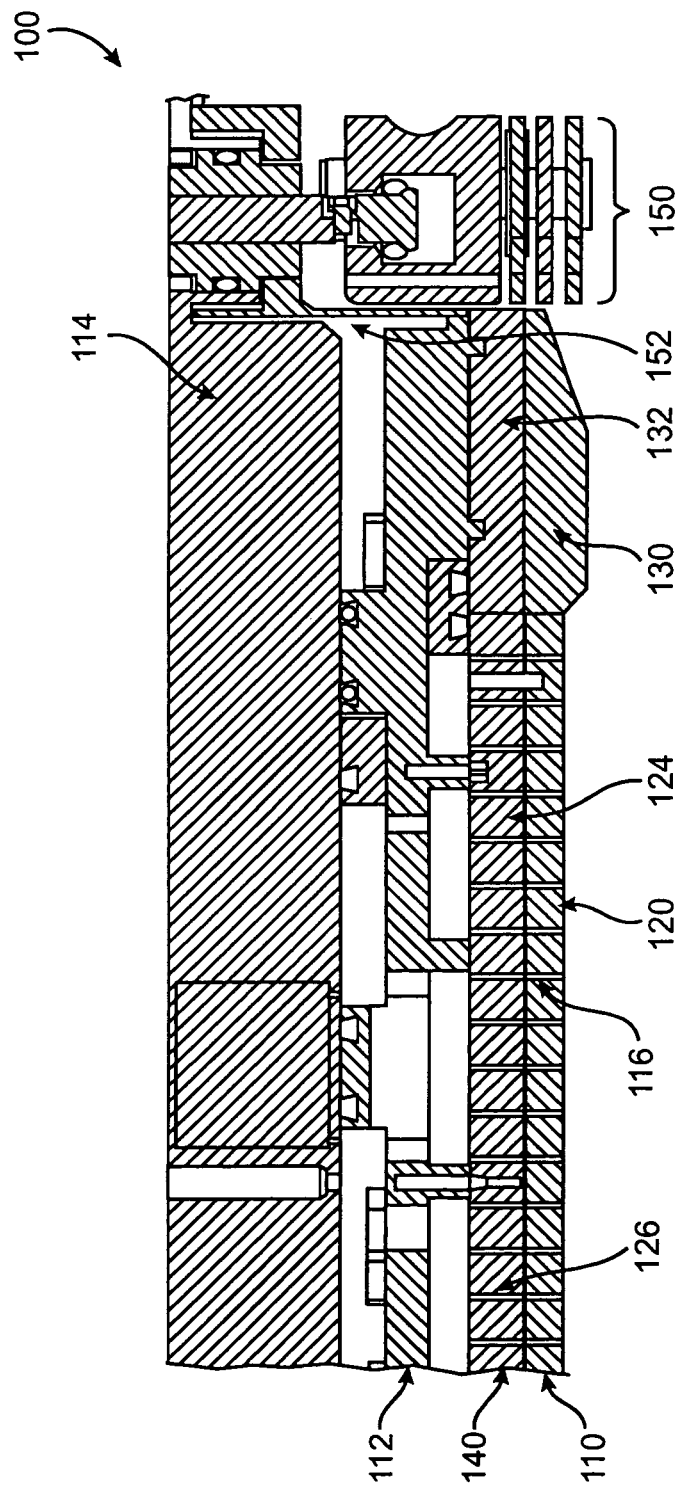
FIG. 1 shows a cross-sectional view of a showerhead electrode assembly of a plasma reactor for etching substrates.

FIG. 1 shows a cross-sectional view of a portion of a showerhead electrode assembly 100 of a plasma reactor for etching substrates. As shown in FIG. 1, the showerhead electrode assembly 100 includes a top electrode 110, a thermal control member 112, and a top plate 114. The top electrode 110 includes an inner electrode 120, and an optional backing member 140 secured to the inner electrode 120. The backing member 140 can include an inner backing member 124 and an optional outer backing member 132. The top plate 114 can form a removable top wall of the plasma processing apparatus, such as a plasma etch chamber. The top electrode 110 preferably includes an inner electrode member 120, and an optional outer electrode member 130. The inner electrode member 120 is preferably a cylindrical plate and may be made of single crystal silicon.

The showerhead electrode assembly 100 as shown in FIG. 1 is typically used with an electrostatic chuck (not shown) having a flat bottom electrode on which a wafer is supported spaced 1 to 2 cm below the top electrode 110. An example of such a plasma processing system is a parallel plate type reactor, such as the Exelan® dielectric etch systems, made by Lam Research Corporation of Fremont, Calif. Such chucking arrangements provide temperature control of the wafer by supplying backside helium (He) pressure, which the rate of heat transfer between the wafer and the chuck.

The top electrode 110 is a consumable part which must be replaced periodically. In a preferred embodiment, the top electrode 110 is a showerhead electrode provided with a plurality of spaced apart gas discharge passages 116, which are of a size and distribution suitable for supplying a process gas, which is energized by the electrode and forms a plasma in a reaction zone 102 (FIG. 3) beneath the electrode 110.

The inner electrode 120 is preferably a planar disk having a uniform thickness from center (not shown) to an outer edge 121. Water is circulated in the cooling channels by water inlet/outlet connections. A plasma confinement ring 150 comprised of a stack of spaced-apart quartz rings surrounds the outer periphery of top electrode 110. The purpose and function of confinement ring 150 is to cause a pressure differential in the reactor and increase the electrical resistance between the reaction chamber walls and the plasma thereby confining the plasma between the upper and lower electrodes.

Process gas from a gas supply is supplied to electrode 110 through one or more passages in the top plate 114. The gas then is distributed through one or more vertically spaced apart baffle plates and passes through gas distribution holes 116 in the electrode 110 to evenly disperse the process gas into reaction zone 102.

The inner electrode member 120 can have a diameter smaller than, equal to, or larger than a wafer to be processed, e.g., up to 300 mm if the plate is made of single crystal silicon, which is the maximum diameter of currently available single crystal silicon material. For processing 300 mm wafers, the outer electrode member 130 is adapted to expand the diameter of the top electrode 110 from about 15 inches to about 17 inches. The outer electrode member 130 can be a continuous member (e.g., a poly-silicon member, such as a ring), or a segmented member (e.g., 2-6 separate segments arranged in a ring configuration, such as segments of single crystal silicon). The inner electrode member 120 preferably includes multiple gas passages 116 for injecting a process gas into a space in a plasma reaction chamber below the top electrode 110.

Single crystal silicon is a preferred material for plasma exposed surfaces of the inner electrode member 120 and the outer electrode member 130. High-purity, single crystal silicon minimizes contamination of substrates during plasma processing as it introduces only a minimal amount of undesirable elements into the reaction chamber, and also wears smoothly during plasma processing, thereby minimizing particles. Alternative materials that can be used for plasma-exposed surfaces of the top electrode 110 include SiC, SiN, and AlN, for example.

In configurations, the showerhead electrode assembly 100 is large enough for processing large substrates, such as semiconductor wafers having a diameter of 300 mm. For 300 mm wafers, the top electrode 110 is at least 300 mm in diameter. However, the showerhead electrode assembly 100 can be sized to process other wafer sizes or substrates having a non-circular configuration.

Figure 2:
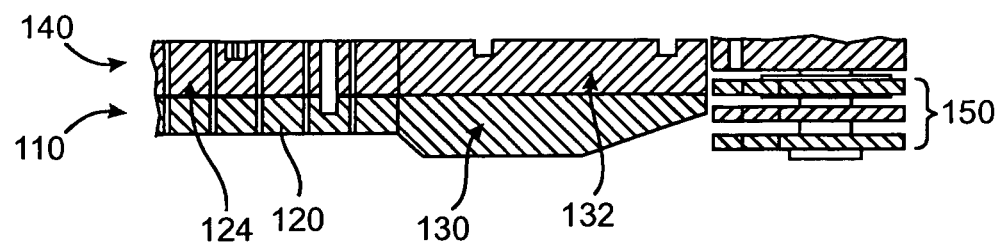
FIG. 2 shows a cross-sectional view of a portion of the showerhead electrode assembly of FIG. 1.

FIG. 2 shows a cross-sectional view of a portion of the showerhead electrode assembly of FIG. 1. As shown in FIG. 2, the showerhead electrode assembly 100 includes the inner electrode 120, the inner backing member 124, the outer electrode 130, the outer electrode outer backing member 132 and the plasma confinement ring 150.

The backing member 140 is comprised of the inner backing member 124 and optionally an outer backing member 132. In such configurations, the inner electrode member 120 is co-extensive with the inner backing member 124, and the outer electrode member 130 is co-extensive with the surrounding backing member 132. However, the inner backing member 124 can extend beyond the inner electrode member 120 such that a single backing member 140 (FIG. 3) can be used to support the inner electrode member 120 and the outer electrode member 130. The inner electrode member 120 and the outer electrode member 130 are preferably attached to the inner and outer backing members 124, 132 with an elastomeric bonding material 160. The inner backing member 124 includes gas passages 126 aligned with the gas passages 116 in the inner electrode member 120 to provide gas flow into the plasma-processing chamber. The gas passages 126 of the inner backing member 124 typically have a diameter of about 0.04 inches, with the gas passages 116 of the inner electrode 120 typically having a diameter of about 0.025 inches.

The inner backing member 124 and outer backing member 132 are preferably made of a material that is chemically compatible with process gases used for processing semiconductor substrates in the plasma processing chamber, have a coefficient of thermal expansion closely matching that of the electrode material, and/or are electrically and thermally conductive. Preferred materials that can be used to make the inner backing member 124 include, but are not limited to, graphite and SiC.

Figure 3:
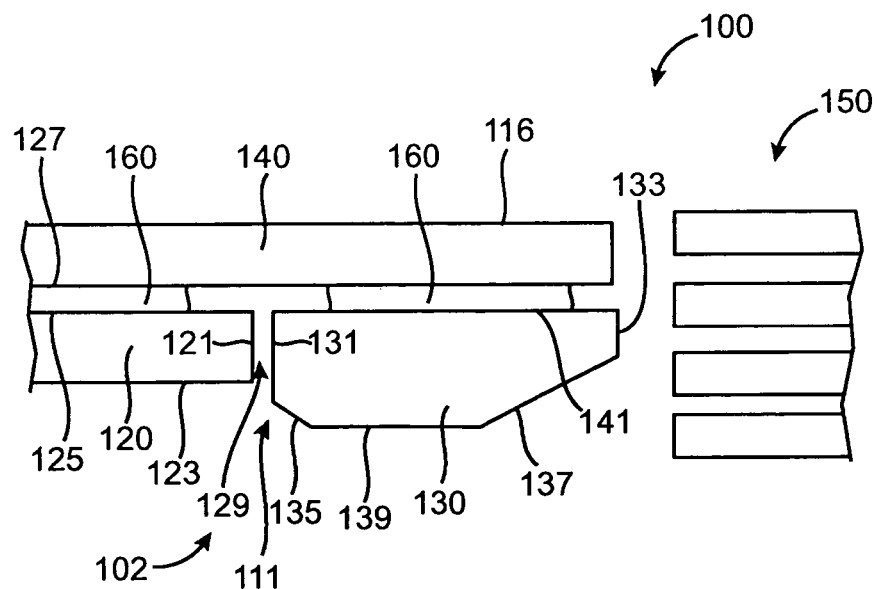
FIG. 3 shows a cross-sectional view of a portion of the showerhead electrode assembly of FIG. 2 comprising a top electrode, a backing member and an outer electrode member.

The inner and the outer electrodes 120, 130 can be attached to the inner backing member 124 and outer backing member 132, respectively with a thermally and electrically conductive elastomeric bonding material 160 (FIG. 3). The elastomeric bonding material 160 allows for relative movement between the top electrode 110 and the backing member 140 during thermal stresses due to thermal cycling. The bonding material 160 also transfers heat and electrical energy between the inner and the outer electrodes 120, 130 and the inner backing member 124 and outer backing member 132. The use of elastomeric bonding material 160 for bonding together surfaces of an electrode assembly 100 is described, for example, in commonly owned U.S. Pat. No. 6,073,577, which is incorporated herein by reference in its entirety.

The inner backing member 124 and the outer backing member 132 are preferably attached to the thermal control member 112 with suitable fasteners, which can be threaded bolts, screws, or the like. For example, bolts (not shown) can be inserted in holes in the thermal control member 112 and screwed into threaded openings in the backing member 140. The thermal control member 112 includes a flexure portion 152 and is preferably made of a machined metallic material, such as aluminum, an aluminum alloy or the like. The top plate 114 is preferably made of aluminum or an aluminum alloy. A plasma confinement ring 150 is shown outwardly of the showerhead electrode assembly 100. A suitable plasma confinement assembly including a vertically adjustable, plasma confinement ring 150 is described in commonly owned U.S. Pat. No. 5,534,751, which is incorporated herein by reference in its entirety.

FIG. 3 shows a cross-sectional view of a portion of the showerhead electrode assembly of FIG. 2 comprising a top electrode 110 having an inner electrode 120, a backing member 140 and an outer electrode 130. The inner electrode 120 and the outer electrode 130 each have a lower or plasma exposed surface 123, 139, and an upper or bonding surface 125, 141. The backing member 140 has a lower or bonding surface 127 and an upper or thermal control surface 116. As shown in FIG. 3, the elastomeric bonding material 160 is applied to and contained within a gap or space 118 between the upper surface 125 of the inner electrode 120, the upper surface 141 of the outer electrode 130 and the lower surface 127 of the backing member 140.

It can be appreciated that the backing member 140 can extend beyond an outer edge 121 of the inner electrode 120, such that a single backing member 140 can be used instead of an inner backing member 124 and an outer backing member 132 as shown in FIG. 2. The outer edge 121 of the inner electrode 120 is typically vertical as shown in FIG. 3. However, it can be appreciated that the outer edge 121 of the inner electrode 120 can have an orientation, which is not vertical.

The outer electrode 130 has an inner edge 131 and an outer edge 133. The inner edge 131 of the outer electrode 130 faces or is adjacent to the outer edge 121 of the inner electrode 120. The outer edge 133 of the outer electrode 130 faces the plasma confinement ring 150. The inner edge 131 and the outer edge 133 of the outer electrode 130 are typically vertical. However, it can be appreciated that as described herein the inner edge 131 and the outer edge 133 can have orientations, which are not vertical.

As shown in FIG. 3, the inner edge 131 and the outer edge 133 of the outer electrode 130 can include an inner surface 135 and an outer surface 137, which are angled towards the lower surface 139 of the outer electrode 130. The inner and outer surfaces 135, 137 with the lower surface 139 of the outer electrode 130 can extend into the zone 102 at a greater depth than the lower surface 123 of the inner electrode 120. The inner surface 135 of the outer electrode 130 can be described as a step 111, as described in commonly owned U.S. Pat. No. 6,824,627, which is incorporated herein by reference in its entirety. The step 111 is provided to control the density of plasma formed adjacent to the exposed lower surfaces 123, 139 during plasma processing. The step 111 is preferably substantially aligned above an edge ring of the lower electrode (not shown) and is positioned just outside the edge of the wafer. The angles of the inner surface 135 and the outer surface 137 are preferably between about 15 and 85 degrees.

As shown in FIG. 3, the bonding material 160 or elastomeric bonding material is typically applied to at least one of the upper or bonding surfaces 125, 141 of the inner and outer electrodes 120, 130 and/or the lower or bonding surface 127 of the backing member 140. After the bonding material 160 is applied to at least one of the bonding surfaces 125, 127, 141, the parts can be assembled such that the bonding surfaces 125, 127, 141 are pressed together. In the case of the electrode 110 and the backing member 140 described above, the electrode 110 can be held in a fixture and plastic pins of the fixture can be used to guide the backing member 140 into precise contact with the electrode 110. Initially, slight pressure such as hand pressure can be used to spread the elastomer or bonding material 160 throughout the joint to be formed. After the elastomer or bonding material 160 is spread, a static load can be applied to the electrode 110 during curing of the bond.

The bond can be cured at ambient or elevated temperature in an atmospheric or protective gas environment. For example, the assembly 100 can be placed in a convection oven and heated to a low temperature to accelerate curing of the bond without inducing thermal strains into the parts to be joined. In the case of the top electrode 110 and the backing member 140 described above, it is desirable to maintain the temperature below 60° C., e.g. 45° to 50° C. for a suitable time, e.g. 3 to 5 hours. After the bond is cured to form the elastomeric joint, the assembly 100 is cooled and the masking material is removed. Further, any additional cleanup and/or further manufacturing steps such as outgassing in a vacuum oven can be carried out depending on the requirements of the assembly operation.

It can be appreciated that as shown in FIG. 3, typically, the pressing together of the bonding surfaces 125, 127, 141, i.e., the inner electrode 120 and the outer electrode 130 with the inner backing member 124 and the outer backing member 132 causes the elastomeric bonding material 160 to fill the gap or space 118 between the inner and outer electrodes 120, 130 and the backing member 124. In addition, the bonding material 160 will typically partially fill the outer electrode gap 129 between the inner edge 121 of the inner electrode 120 and the inner edge 131 of the outer electrode 130. However, the exposure of the elastomeric bonding material 160 to direct plasma etch as well as the attack of radicals generated by plasma can result in damage and/or bond loss to the elastomeric bond material 160 as well as aluminum (Al) ball particle generation.

During plasma processing, the elastomer bonded electrodes are able to sustain high operation temperatures, high power densities, and long RF hours. Accordingly, etch tools with a showerhead or electrode assembly 110 as described herein have been widely used in semiconductor wafer etch processes. The widely successful uses of this kind of electrodes are largely due to such electrodes having electrical conductivity and high thermal conductivity. More specifically, the high conductivities are largely due to the use of Al particles (which appear as microscopic Al balls) as filler in the elastomeric bonding material 160 (the filler is typically a powdery material made of Al alloy), which is commonly called Al powder or Al ball. However, the Al filler inevitably with shed Al particles when the elastomer or bonding material 160 is etched away by the plasma during wafer etch. As a result, Al particles can fall on the product wafer surface causing Al ball-based defects. In addition, it has been found that Al ball defects are likely to form in a combination of adverse etch conditions such as the advanced 65 nm etch technologies and require a long time dry clean applied between etching the wafers.

Generally, Al ball particles are generated from either direct plasma attack of the elastomer or bonding material 160 and radicals generated by the plasma attacking the elastomer or bonding material 160. In the direct plasma attack of the bonding material 160, the residual bonding material remaining inside the outer electrode gap 129 between the inner electrode 120 and the outer electrode 130 is etched by plasma due to the residues being exposed to the direct inline plasma. Alternatively, the radical attack of elastomer bonding material 160 is caused by the elastomer bonding material 160 suffering form an attack from the radicals generated by the plasma. The radicals however, do not move in the directions of the plasma charged ions. In addition, the radicals have a much longer lifetime than the ions. Accordingly, a radical can randomly move to anywhere once it maintains its lone electron and energy. Thus, the radicals have a high potential to attack the elastomer or bonding material 160 resulting in bond material loss and Al particle generation.

Figure 4:
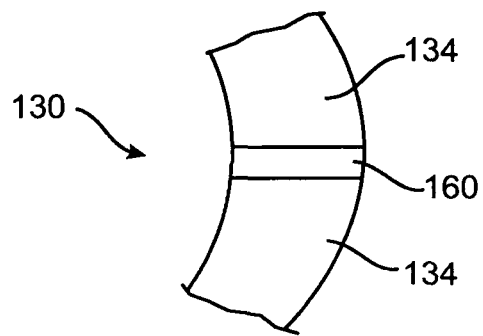
FIG. 4 shows a cross-sectional view of a portion of the outer electrode of FIG. 3.

FIG. 4 shows a cross-sectional view of a portion of the outer electrode 130 of FIG. 3. As shown in FIG. 4 the outer electrode 130 is preferably comprised of a plurality of segments 134, wherein the segments 134 are attached to one another with an elastomeric bonding material 160. The plurality of segments 134 allow for the expansion of the outer electrode 130 during processing of a semiconductor substrate in the processing zone 102. During processing, heat is transferred from the inner electrode 120 and the outer electrode 130 to the inner backing member 124 and outer backing member 132 and then to the top plate 114 via thermal conduction.

Figure 5:
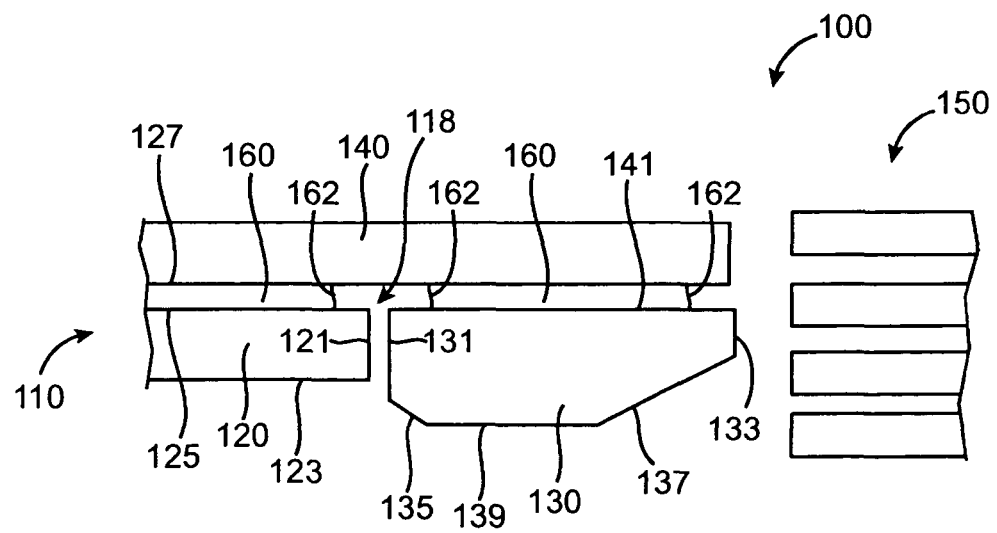
FIG. 5 shows a cross-sectional view of a portion of the showerhead electrode having an elastomeric bond according to one embodiment.

FIG. 5 shows a cross-sectional view of a portion of the showerhead electrode of FIG. 1 having an elastomeric bond having an edge exclusion bond. As shown in FIG. 5, a precision dispensing of elastomer bonding material 160 is deposited on the bonding surfaces 125, 141 of the inner and outer electrodes 120, 130 and/or the bonding surface 127 of the backing member 140 and filling only a portion of the gap or space 118 between the inner and outer electrodes 120, 130 and the backing member 140. The precision dispensing of the bonding material prevents excess bonding material 160 from filling the outer electrode gap 129. In addition, it can be appreciated that not only is the outer electrode gap 129 free of elastomeric bonding material 160, but the bonding surfaces 125, 141 of the inner electrode 120 and the outer electrode 130 and the inner backing member 124 in the vicinity of the outer electrode gap 129 including the outer edge 121 and inner edge 131 of the inner and outer electrodes 120, 130 is free of excess bonding material 160.

FIG. 6 shows a cross-sectional view of a portion of the showerhead electrode assembly 100 of FIG. 5 having the edge exclusion zone bond. As shown in FIG. 6, the precision dispensing of elastomeric bonding material 160 between the inner electrode 120, the outer electrode 130 and the backing member 140 avoids any excess or overflow of the elastomeric bonding material 160 to areas or surfaces outside the bonding areas. In use, for a top electrode 110 of at least 300 mm in diameter, the bonding material 160 has an outer edge 162, which is preferably 1 to 3 mm from the outer electrode gap 129 and more preferably about 1 to 1.5 mm from the outer electrode gap 129. In addition, it can be appreciated that the outer edge 162 of the bonding material 160 is preferably 1 to 3 mm from the outer edge 121 of the inner electrode 120, and the inner edge 131 and outer edge 133 of the outer electrode 130. In addition, it can be appreciated that the outer edge 162 of the bonding material 160 is more preferably 1 to 1.5 mm from the outer edge 121 of the inner electrode 130, and the inner edge 131 and outer edge 133 of the outer electrode 130.

FIG. 7 shows a top view of a portion of an inner electrode 120 having a precision dispensing of elastomeric bonding material 160 according to a further embodiment. As shown in FIG. 7, the outer edge 162 of bonding material 160 is preferably 1 to 3 mm from the outer edge 121 and more preferably about 1 to 1.5 mm from the outer edge 121 of the inner electrode 120.

FIG. 8 shows a top view of a portion of a single or multi part outer electrode 130 for precision dispensing of bonding material 160 wherein the bonding surfaces 202 are irregularly shaped. For example, the outer electrode 130 in a plasma reactor or chamber is typically circular in nature (i.e., a ring) having a generally irregular shape to the extent that the edges 131, 133 of the outer electrode 130 are not at right angles to one another nor do they run parallel to one another. Accordingly, in order to obtain a desired edge exclusion bond, the bonding surface 202 can include a plurality of recesses 200 configured to receive a portion of the elastomeric bonding material 160. The plurality of recesses 200 is preferably strategically positioned on the bonding surface 202 and can have any suitable shape or configuration. The recesses 202 are preferably concave in configuration having a depth 204 of about 0.1 to 1.0 mm. However, it can be appreciated that the recesses 202 can have any suitable cross sectional configuration. During the bonding process, the recesses 202 control the flow of bonding material 160 by preventing the outer edge 162 (FIG. 7) of bonding material 160 from extending beyond a desired location relative to the outer edge 131 of the electrode 130.

FIG. 9 shows a cross-sectional view of an interface of a multi-part outer electrode 130 and the outer backing member 132. As shown in FIG. 9, the multi-part outer electrode 130 includes a lower or plasma exposed surface 139 and an upper or bonding surface 141. The outer electrode 130 is comprised of a plurality of segments 134, wherein each of the plurality of segments 134 includes a mating surface comprised of an upper flange 136 and a lower flange 138, which overlap each other to protect the underlying bonding material 160 from line of sight exposure to plasma or radicals generated by the plasma during plasma processing. It can be appreciated that each of the plurality of segments 134 can include one flange 136, 138 or both upper and lower flanges 136, 138.

As shown in FIG. 9, the upper flange 136 includes a first or upper vertical surface 149, a horizontal surface 148 and a second or lower vertical surface 147. The lower flange 138 includes a corresponding first or upper vertical surface 146, a horizontal surface 145, and a second or lower vertical surface 144. The upper vertical surfaces 146, 149 forming an upper gap 153, the horizontal surfaces 145, 148 forming a horizontal gap 152, and the lower vertical surfaces 144, 147 forming a lower gap 151. The overlapping edges 136, 138 protect the bonding material 160 by preventing the bonding material 160 from line of sight exposure to either the plasma or radicals from the plasma. As shown, when assembled, the bonding surfaces 141 of the multi-part outer electrode 130 and the bonding surface 127 of the outer backing member 132 are preferably filled with an elastomeric bonding material 160. The bonding material 160, however, only partially fills the upper gap 153, and leaves the horizontal gap 152 and lower gap 151 free of bonding material 160. Accordingly, during plasma processing, the plasma and radicals are unable to attack the bonding material 160, which results in no loss of bonding material 160 or Al ball generation.

FIG. 10 shows a view of a portion of the multi-part outer electrode 130 of FIG. 9 including the elastomeric bonding material 160 within the upper gap 153. As shown in FIG. 10, the outer electrode 130 is comprised of a plurality of segments 134 each having an upper flange 136 and a lower flange 138. The upper flange 136 and the lower flange 138 overlap one another to protect the bonding material 160 from either direct plasma attack or radicals generated by the plasma. As shown in FIG. 10, since the lower gap 151 and the upper gap 153 do not align with one another, the plasma and radicals from the plasma do not include line of sight exposure to the bonding material 160.

Figure 11:
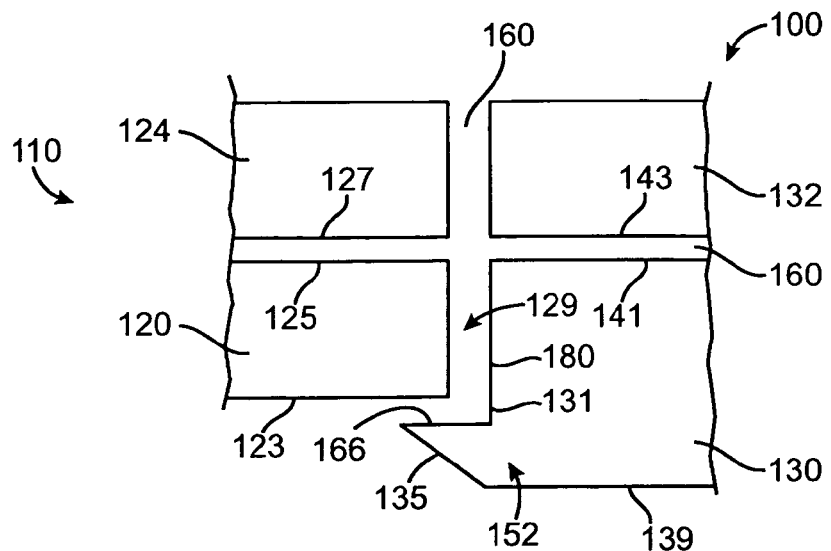
FIG. 11 shows a cross sectional view of a portion of a showerhead electrode assembly according to another embodiment.

FIG. 11 shows a cross sectional view of a portion of a showerhead electrode assembly 100 according to a further embodiment. As shown in FIG. 11, the top electrode 110 includes an inner electrode 120, an inner backing member 124, an outer electrode member 130 and an outer backing member 132. The inner electrode 120 and the outer electrode 130 each have a lower surface 123, 139, which is exposed to the plasma zone (not shown). As shown in FIG. 11, the elastomer bonding material 160 fills the gaps between the bonding surface 125 of the inner electrode 120 and the bonding surface 127 of the inner backing member 124, and the bonding surface 141 of the outer electrode 130 and a lower or bonding surface 143 of the outer backing member 132. The bonding material 160 also typically fills a portion of the outer gap 129 or interface between the inner electrode 120 and the outer electrode 130. The outer edge 121 of the inner electrode 120 is typically vertical as shown in FIG. 11.

As shown in FIG. 11, the inner edge 131 of the outer electrode 130 includes a lower flange 152, which protrudes from the inner surface 180 of the outer electrode 130. The lower flange 152 includes a horizontal surface 166 extending from the inner surface 180 of the outer electrode 130 and beneath the lower surface 123 of the inner electrode 120. The lower flange 152 also includes an inner surface 135 connecting the horizontal surface 166 with the lower surface 139 of the outer electrode 130. The lower flange 152 prevents the plasma and radicals generated by the plasma from having a direct path to the bonding material 160 within the outer gap 129.

Figure 12:
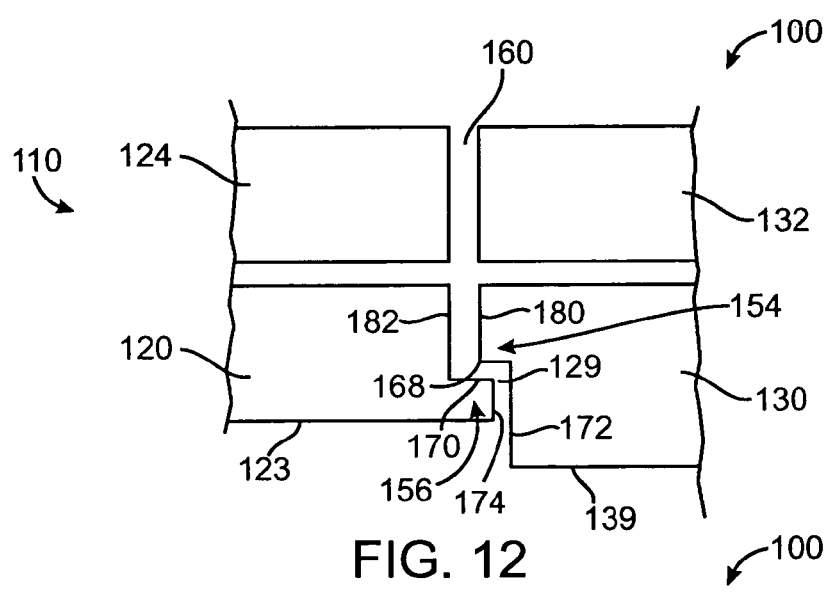
FIG. 12 shows a cross sectional view of a portion of a showerhead electrode assembly according to a further embodiment having an interlocking configuration between the interface of the inner electrode and the outer electrode.

FIG. 12 shows a cross sectional view of a portion of a showerhead electrode assembly 100 according to another embodiment having an interlocking design in the interface or outer gap 129 between the inner electrode 120 and the outer electrode 130. As shown in FIG. 12, the inner electrode 120 has a lower flange 156, and the outer electrode 130 has an upper flange 154, wherein the upper flange 158 and the lower flange 158 overlap one another forming an interlocking configuration. The upper flange 154 includes a first or upper vertical surface 180, a horizontal surface 168 and a second or lower vertical surface 172. The lower flange 156 includes a corresponding first or upper vertical surface 182, a horizontal surface 170, and a second or lower vertical surface 174. The overlapping flanges 154, 156 protect the bonding material 160, which partially fills a portion of the outer gap 129, by preventing the bonding material 160 from being line of sight exposure to either the plasma or radicals from the plasma. As shown in FIG. 12, the lower flange 156 extends underneath the upper flange 154. However, it can be appreciated that in an alternative embodiment, the flange 156 of the outer electrode 130 can be configured to extend underneath the flange 154 of the inner electrode 120. It also can be appreciated that in an alternative embodiment as shown in FIG. 12, the lower vertical surface 172 of the outer electrode 130 can extending into the zone (not shown) and below the lower surface 123 of the inner electrode 120 forming a stepped electrode assembly.

Figure 13:
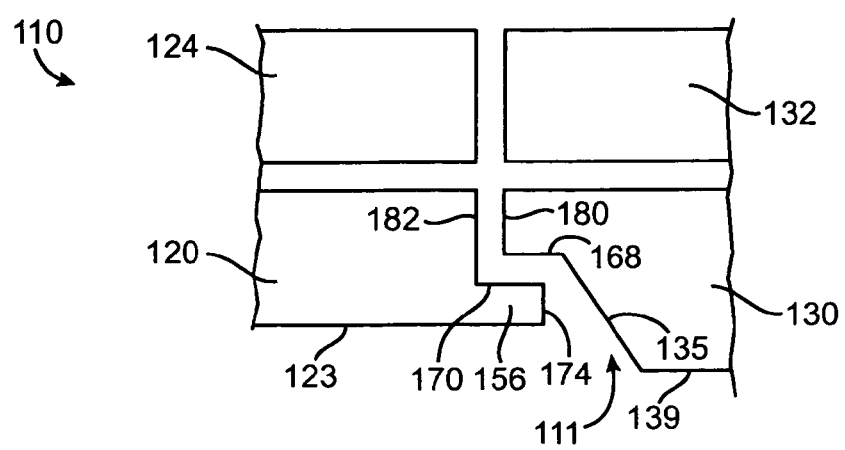
FIG. 13 shows a cross sectional view of a portion of a showerhead electrode assembly according to another embodiment having an interlocking configuration between the interface of the inner electrode and the outer electrode.

FIG. 13 shows a cross sectional view of a portion of a showerhead electrode assembly 100 according to a further embodiment having an interlocking design in the interface or outer gap 129 of the inner electrode 120 and the outer electrode 130. As shown in FIG. 13, the inner electrode 120 has a lower flange 156 with a first or upper vertical surface 182, a horizontal surface 170, and a second or lower vertical surface 174. The outer electrode 130 includes an inner surface 180, a horizontal surface 168 and an inner surface 135 extending to the lower surface 139 of the outer electrode 130. As shown the inner surface 135 and the lower surface 139 of the outer electrode 130 form a step 111, which can provide etch rate uniformity at the edge of the wafer (not shown).

Figure 14:
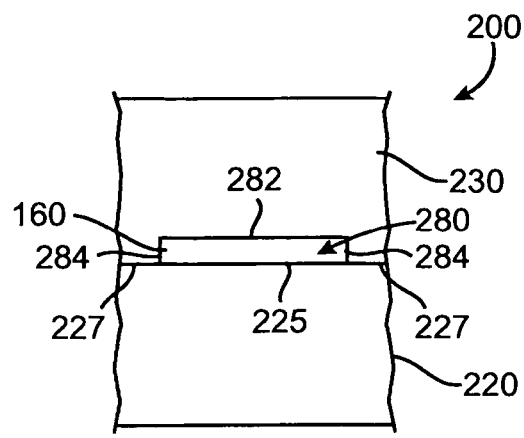
FIG. 14 shows a cross sectional view of a portion of a showerhead electrode assembly according to a further embodiment.

FIG. 14 shows a cross sectional view of a portion of an electrode assembly 200 according to another embodiment. The electrode assembly 200 can be an inner electrode 220 and a backing member 230, or a portion of a single or multiple segmented outer electrode ring having an outer electrode 220 and a backing member 230. As shown in FIG. 14, an electrode 220 and a backing member 230 can be attached to one another using at least one bond material recess 280 within the bonding surface 227 of the backing member 230. Each of the at least one bond material recess 280 includes a pair of vertical surfaces 284 and an upper horizontal surface 282.

In use, the bonding material 160 can be any suitable elastomeric material. The bonding material 160 is placed into the recess 280 and the backing member 230 is pressed onto the bonding surface 225 of the electrode 220. The amount of elastomeric bonding material 160 is measured and placed into the recess 280 such that the bonding surface 227 of the backing member 230 and the bonding surface 225 of the electrode 220 are in contact with one another forming a seal, which prevents the elastomeric or bonding material 160 from expanding outside of the at least one recess 280.

Figure 15:
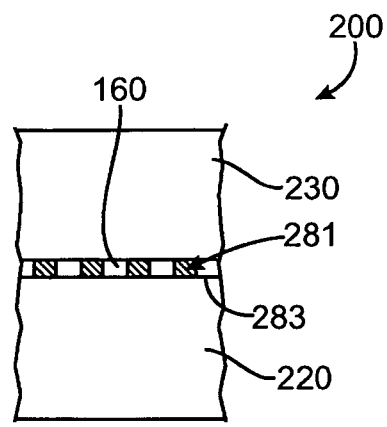
FIG. 15 shows a cross sectional view of a portion of a showerhead electrode assembly according to another embodiment.

FIG. 15 shows a cross sectional view of a portion of an electrode assembly 200 according to a further embodiment. As shown in FIG. 15, the backing member 230 has at least one spacer 281, which maintains a finite distance or gap 283 between the backing member 230 and the electrode 220 during thermal cycling. The at least one spacer 281 is preferably an aluminum wire, rod, rod or wire mesh, or other suitable material. The at least one spacer 281 also prevent particle generation caused by rubbing between the electrode 220, and the backing member 230 during thermal cycling by maintaining the finite distance or gap 283 between the bonding surfaces of the inner and outer electrodes 220 and the backing member 230.

Figure 16:
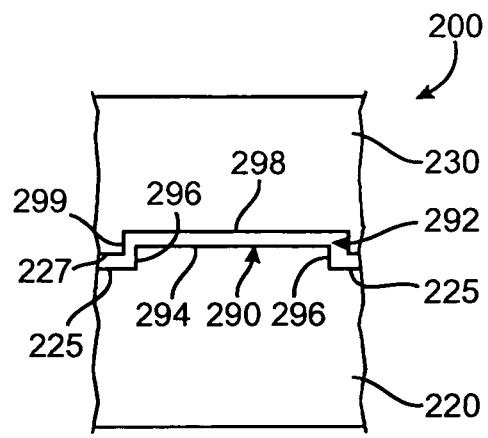
FIG. 16 shows a cross sectional view of a portion of a showerhead electrode assembly according to a further embodiment.

FIG. 16 shows a cross sectional view of a portion of an electrode assembly 200 according to another embodiment. As shown in FIG. 16, the electrode 220 includes a boss 290, which is received within a recess 292 within the backing member 230. The boss 290 includes a pair of vertical surfaces 296 extending from the bonding surface 225 of the electrode 220 and an upper surface 294. The recess 292 includes a lower surface 298 and a pair of vertical surfaces 299. As shown in FIG. 16, the elastomeric bonding material 160 is applied within the recess 292 and on top of the boss 290. This provides an elastomeric joint, which is not exposed to either the plasma or radicals generated by the plasma during plasma processing. In addition, the bonding material 160 introduces a gap or space 297 between the upper surface 225 of the electrode 220 and the lower surface 227 of the backing member 230.

Figure 17:
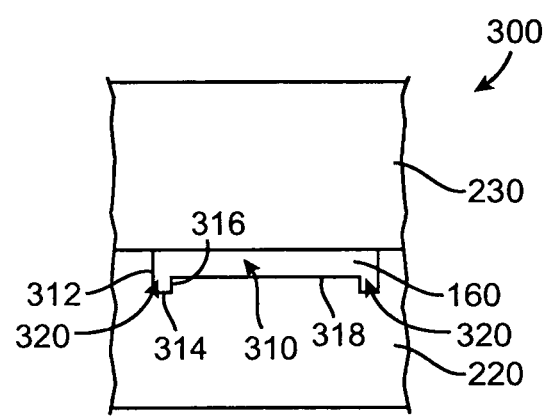
FIG. 17 shows a cross sectional view of a portion of a showerhead electrode assembly according to another embodiment.

FIG. 17 shows a cross sectional view of a portion of an electrode assembly 300 according to another embodiment. The electrode assembly 300 can be an inner electrode 220 and a backing member 230, or a portion of a single or multiple segmented outer electrode ring having an outer electrode 220 and a backing member 230. As shown in FIG. 17, the electrode 220 includes a recess 310 configured to receive a bonding material 160. The recess 310 includes a lower surface 318 and a pair of vertical surfaces 312. The recess 310 can also include an outer groove 320 comprising a lower surface 314 and an inner vertical surface 316, which extends from the lower surface 314 to the lower surface 318 of the recess 310. The outer groove 320 acts as a receptacle at the edge of the interlocking members to trap any excessive elastomer or bonding material 160 resulting from non-uniform elastomer bonding material dispensing. Alternatively, if the electrode assembly 300 is an outer electrode ring, the outer electrode ring will include an inner and an outer groove 320.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents, which fall within the range of the claims, are intended to be embraced therein.

What is claimed is:

1. An electrode assembly for a plasma reaction chamber used in semiconductor substrate processing comprising:
    a backing member having a bonding surface;
    an inner electrode having a lower surface, which is configured to be exposed to a plasma zone on one side and a bonding surface on the other side;
    an outer electrode having a lower surface, which is configured to be exposed to the plasma zone on one side and a bonding surface on the other side, and wherein at least one of the electrodes has a flange which extends underneath at least a portion of the lower surface of the other electrode; and
    a bonding material, which partially fills a portion of an interface between the inner and outer electrodes and wherein the at least one flange eliminates a line of sight from the plasma zone to the bonding material.

2. The electrode assembly of claim 1, wherein the flange is on the inner electrode and extends underneath the lower surface of the outer electrode.

3. The electrode assembly of claim 1, wherein the flange is on the outer electrode and extends underneath the lower surface of the inner electrode.

4. The electrode assembly of claim 1, wherein each of the electrodes includes a flange and the flange of the outer electrode extends underneath the flange of the inner electrode.

5. The electrode assembly of claim 1, wherein each of the electrodes includes a flange and the flange of the inner electrode extends underneath the flange of the outer electrode.

6. The electrode assembly of claim 3, wherein an inner surface of the outer electrode includes an angular surface extending from the flange to the lower surface of the outer electrode.

7. The electrode assembly of claim 1, wherein the outer electrode includes a plurality of segments forming an outer electrode ring and having an overlapping surface at an interface of each of the plurality of segments.

8. The electrode assembly of claim 7, wherein the interface of each of the plurality of segments further includes an upper flange and a lower flange.

9. The electrode assembly of claim 1, comprising:
    a bonding material between the bonding surfaces of the inner and outer electrodes and the backing member.

10. The electrode assembly of claim 1, wherein the backing member comprises an inner backing member and an outer backing member, and further wherein the bonding surfaces are co-extensive.

11. The electrode assembly of claim 1, wherein the inner electrode and the outer electrode are made from silicon.

12. The electrode assembly of claim 1, wherein the backing member is made from graphite.

13. The electrode assembly of claim 1, wherein the backing member includes a recess and the inner electrode or outer electrode has a boss received within the recess of the backing member.

14. The electrode assembly of claim 1, wherein:
    at least one spacer maintains a gap between the bonding surfaces of the backing member and the electrode; and
    a bonding material is located between the bonding surfaces of the backing member and the electrode.

15. The electrode assembly of claim 1, wherein the inner electrode or outer electrode has a recess for receiving a bonding material and an outer groove to trap excess bonding material.

16. The electrode assembly of claim 15, wherein the outer electrode includes the recess, and wherein the recess includes an inner groove and an outer groove to trap excess bonding material.

17. The electrode assembly of claim 1, wherein the bonding surface of the outer electrode includes a plurality of recesses.

18. The electrode assembly of claim 1, wherein a horizontal gap between opposed surfaces of the inner and outer electrodes is free of the bonding material, and a vertical gap between opposed surfaces of the inner and outer electrodes is partially filled with the bonding material.

19. The electrode assembly of claim 1, wherein the flange includes an inner surface connecting a horizontal surface with the lower surface of the outer electrode.

20. The electrode assembly of claim 1, comprising:
a plasma confinement ring assembly comprised of a stack of spaced-apart quartz rings, which surrounds an outer periphery of the backing member and the outer electrode.

21. An electrode assembly for a plasma reaction chamber used in semiconductor substrate processing comprising:
a backing member having a bonding surface;
an inner electrode having a lower surface, which is configured to be exposed to a plasma zone on one side and a bonding surface on the other side;
an outer electrode having a lower surface on one side and a bonding surface on the other side, and wherein the outer electrode has a flange which extends underneath at least a portion of the lower surface of the inner electrode; and
a bonding material, which partially fills at least a portion of a vertical gap between opposed surfaces of the inner and outer electrodes and wherein the flange eliminates a line of sight from the plasma zone to the bonding material.

22. The electrode assembly of claim 21, wherein a horizontal gap between opposed surfaces of the inner and outer electrodes is free of the bonding material.

23. The electrode assembly of claim 21, comprising:
a plasma confinement ring assembly comprised of a stack of spaced-apart quartz rings, which surrounds an outer periphery of the backing member and the outer electrode.

* * * * *